(12) United States Patent
Sivonen et al.

(10) Patent No.: US 8,503,963 B2
(45) Date of Patent: Aug. 6, 2013

(54) AMPLIFIER WITH ON-CHIP FILTER

(75) Inventors: Pete Sivonen, Helsinki (FI); Jonne Riekki, Espoo (FI); Jouni Kaukovuori, Ventaa (FI); Sami Vilhonen, Lieto (FI); Jarkko Jussila, Helsinki (FI)

(73) Assignee: St-Ericsson SA, Plan-les-Ouates (CH)

( * ) Notice: Subject to any disclaimer, the term of this patent is extended or adjusted under 35 U.S.C. 154(b) by 40 days.

(21) Appl. No.: 13/173,973

(22) Filed: Jun. 30, 2011

(65) Prior Publication Data

US 2012/0171980 A1    Jul. 5, 2012

Related U.S. Application Data

(63) Continuation of application No. PCT/EP2009/067988, filed on Dec. 29, 2009.

(30) Foreign Application Priority Data

Dec. 30, 2008 (EP) .................................... 08254185

(51) Int. Cl.
*H04B 1/10* (2006.01)
(52) U.S. Cl.
USPC ............................ 455/307; 455/213; 455/333
(58) Field of Classification Search
USPC ................ 455/147, 213, 293, 296, 307, 326, 455/334, 323, 333; 330/306, 254, 282, 283, 330/293
See application file for complete search history.

(56) References Cited

U.S. PATENT DOCUMENTS 5,434,541 A * 7/1995 Knoedl, Jr. ..................... 330/306
6,347,221 B1 * 2/2002 Tsukahara et al. ............. 455/333
(Continued)

FOREIGN PATENT DOCUMENTS

EP      0 690 568 A1    1/1996
WO   2006/097835 A2    9/2006
WO   2007/107633 A1    9/2007

OTHER PUBLICATIONS

European Search Report in corresponding European Application No. 08254185.5-1233 mailed Jun. 29, 2009.

(Continued)

*Primary Examiner* — Junpeng Chen
(74) *Attorney, Agent, or Firm* — Patent Portfolio Builders, PLLC

(57) ABSTRACT

An integrated circuit for a radio receiver comprising a radio-frequency amplifier and a radio-frequency filter is described. The amplifier receives radio-frequency signals from an antenna, the filter is connected to the amplifier output, and the output of the filter is provided to a processing stage of the receiver. The amplifier comprises an amplifying stage controlled by a radio-frequency input signal and a signal fed back from the filter. The amplifier input impedance is substantially matched to the antenna impedance at a frequency band of interest. The signal fed back from the filter providing attenuation of signals outside the frequency band of interest at the amplifier input. The filter comprises one or more filter components. A filter component comprises a first input and a second input for receiving the amplifier output, a first switch arranged to selectively connect the first input to a first impedance, a second switch arranged to selectively connect the first input to a second impedance, a third switch arranged to selectively connect the second input to the first impedance, and a fourth switch arranged to selectively connect the second input to the second impedance. The first and fourth switches are controlled by a first oscillator signal and the second and third switches are controlled by a second oscillator signal that is 180° out of phase with the first oscillator signal.

16 Claims, 9 Drawing Sheets

U.S. PATENT DOCUMENTS

| | | | |
|---|---|---|---|
| 7,139,546 B1* | 11/2006 | Petrov et al. | 455/323 |
| 7,155,194 B2* | 12/2006 | Chiu et al. | 455/323 |
| 7,164,897 B2* | 1/2007 | Manku et al. | 455/293 |
| 7,826,816 B2* | 11/2010 | Zhuo et al. | 455/315 |
| 7,890,076 B2* | 2/2011 | Mattisson et al. | 455/323 |
| 2003/0007377 A1* | 1/2003 | Otaka | 363/127 |
| 2008/0014896 A1* | 1/2008 | Zhuo et al. | 455/326 |
| 2008/0125073 A1* | 5/2008 | Butaye et al. | 455/323 |

OTHER PUBLICATIONS

International Search Report in corresponding International Application No. PCT/EP2009/067988 mailed Apr. 1, 2010.

Written Opinion in corresponding International Application No. PCT/EP2009/067988 mailed Apr. 1, 2010.

Hooman Darabi; "A Blocker Filtering Technique for SAW-Less Wireless Receivers"; IEEE Journal of Solid-State Circuits, vol. 42, No. 12; Dec. 2007; pp. 2766-2773; Irvine, CA.

Paolo Rossi, et al.; "A Variable Gain RF Front-End, Based on a Voltage-Voltage Feedback LNA, for Multistandard Applications"; IEEE Journal of Solid-State Circuits, vol. 40, No. 3; XP011128276; Mar. 1, 2005; pp. 690-697; Piscataway, NJ.

Jere A. M. Järvinen, et al.; "2.4-GHz Receiver for Sensor Applications"; IEEE Journal of Solid-State Circuits; vol. 40, No. 7; XP011135448; Jul. 1, 2005; pp. 1426-1433; Piscataway, NJ.

* cited by examiner

AMPLIFIER WITH ON-CHIP FILTER

The present invention relates to integrated circuits for radio receivers.

BACKGROUND OF THE INVENTION

In a typical wireless radio receiver, an external radio frequency (RF) pre-selection filter is used at the front of the actual integrated radio receiver circuit (RXIC) to filter out harmful out-of-band blocking signals and to alleviate the linearity requirements of the RXIC. With current technologies, pre-selection filter can not be integrated on silicon, because the required quality (Q) factors in the filter can not be realized. In most cases, RF filters are realized either with surface or bulk acoustic wave techniques (SAW/BAW). In present technologies, since the center frequencies of the SAW/BAW filters are fixed, several pre-selection filters are needed in radio receivers for multi-standard or multi-mode applications, increasing the cost and complexity.

One known amplifier design is described in P. Rossi et al, "A Variable Gain RF Front-End, Based on Voltage-Voltage Feedback LNA, for Multistandard Applications", IEEE J. Solid-State Circuits", vol. 40, pp. 690-697, March 2005. One known filter design is described in EP 1867042.

In multi-mode radio receivers, multiple RF pre-selection filters, switches, and baluns increase significantly the cost of the radio receiver. In addition, this decreases the integration level of the receiver, and increase the bills-of-material (BOM) and complexity of the printed circuit board (PCB). The cost of the actual RXIC is also increased due to the fact that several RF input pins, which are also usually balanced, are needed. Since the RF pre-selection filter (and the possible switches) has finite loss at its passband, it lowers the tolerable noise figure (NF) of the RXIC.

Harmful out-of-band blocking signals can drive the radio receiver to compression. In other words, due to the nonlinearity in the radio receiver, a large blocking signal can desensitize the receiver or reduce the gain of the small desired signal. In addition, blocking signals can increase the receiver NF.

SUMMARY OF INVENTION

In accordance with one aspect of the invention, there is provided an integrated circuit for a radio receiver, the circuit comprising: a radio-frequency amplifier and a radio-frequency filter; the amplifier arranged to receive radio-frequency signals from an antenna, the filter being connected to the amplifier output, and the output of the filter being provided to a processing stage of the receiver; the amplifier comprising an amplifying stage controlled by a radio-frequency input signal and a signal fed back from the filter, the amplifier input impedance being substantially matched to the antenna impedance at a frequency band of interest, the signal fed back from the filter providing attenuation of signals outside the frequency band of interest at the amplifier input, the filter comprising at least a first filter component, the first filter component comprising: a first input and a second input for receiving the amplifier output; a first switch arranged to selectively connect the first input to a first impedance; a second switch arranged to selectively connect the first input to a second impedance; a third switch arranged to selectively connect the second input to the first impedance; and a fourth switch arranged to selectively connect the second input to the second impedance; the first and fourth switches being controlled by a first oscillator signal and the second and third switches being controlled by a second oscillator signal that is 180° out of phase with the first oscillator signal.

In accordance with a second aspect, there is provided an integrated circuit for a radio receiver, the circuit comprising: a radio-frequency amplifying means for receiving radio-frequency signals from an antenna; and a radio-frequency filtering means for providing an output to a processing stage of the receiver and receiving an input from the amplifying means, the amplifying means comprising an amplifying stage controlled by a radio-frequency input signal and a signal fed back from the filtering means, the amplifying means input impedance being substantially matched to the antenna impedance at a frequency band of interest, the signal fed back from the filtering means providing attenuation of signals outside the frequency band of interest at the amplifying means input, the filtering means comprising at least a first filter component, the first filter component comprising: a first input means and a second input means for receiving an output from the amplifying means; a first switching means for selectively connecting the first input means to a first impedance; a second switching means for selectively connecting the first input means to a second impedance; a third switching means for selectively connecting the second input means to the first impedance; and a fourth switching means for selectively connecting the second input means to the second impedance; the first and fourth switching means being controlled by a first oscillator signal and the second and third switching means being controlled by a second oscillator signal that is 180° out of phase with the first oscillator signal.

DESCRIPTION OF THE DRAWINGS

Embodiments of the invention will now be described, by way of example only, with reference to the Figures in which.

DETAILED DESCRIPTION OF EMBODIMENTS

Figure 1:
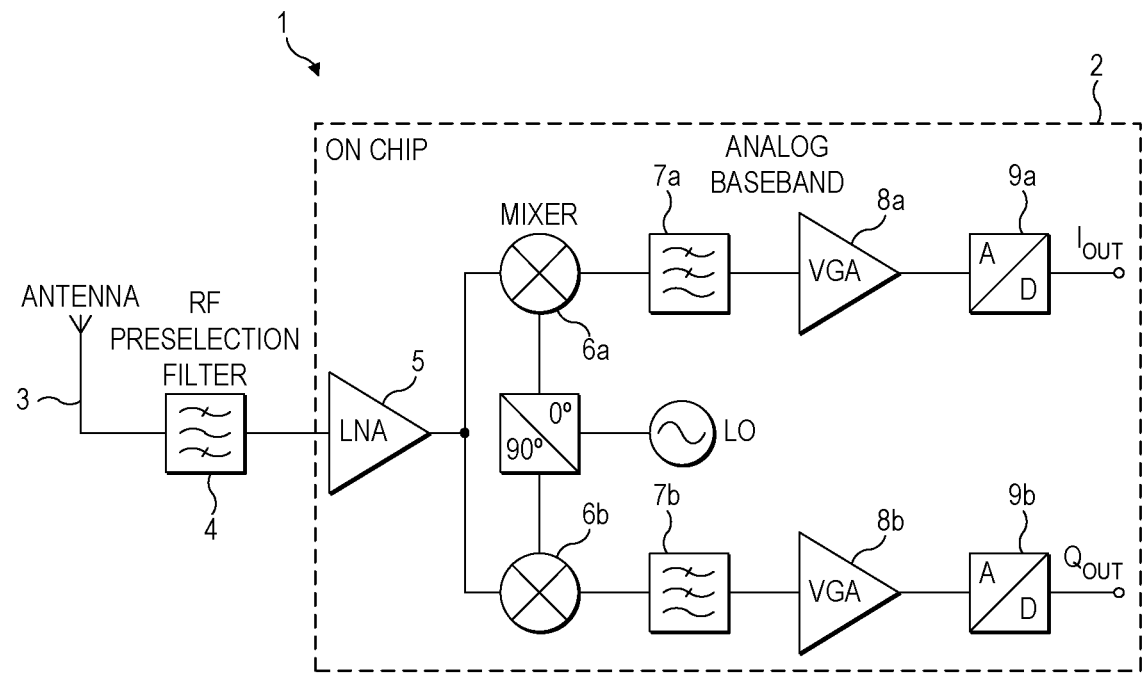
FIG. 1 is a block diagram of a single-band zero-IF receiver architecture.

FIG. 1 is a block diagram of a single-band zero-IF receiver architecture. In the receiver 1 illustrated in FIG. 1, the antenna 3 feeds the received RF signal to an RF band-pass filter 4 (pre-selection filter) that performs the pre-selection of the received RF band. The LNA 5, which is usually the first integrated block of the receiver IC 2, amplifies the RF signal in order to reduce the noise contributions of the following stages. I and Q down-conversion mixers 6a, 6b convert the signal to analog baseband. The down-converted signals are filtered by respective low-pass filters 7a, 7b output to respective variable gain stages 8a, 8b. Finally, respective analog-to-digital converters (ADC) 9a, 9b convert the analog signal from the respective gain stages 8a, 8b to a digital form.

Figure 2:
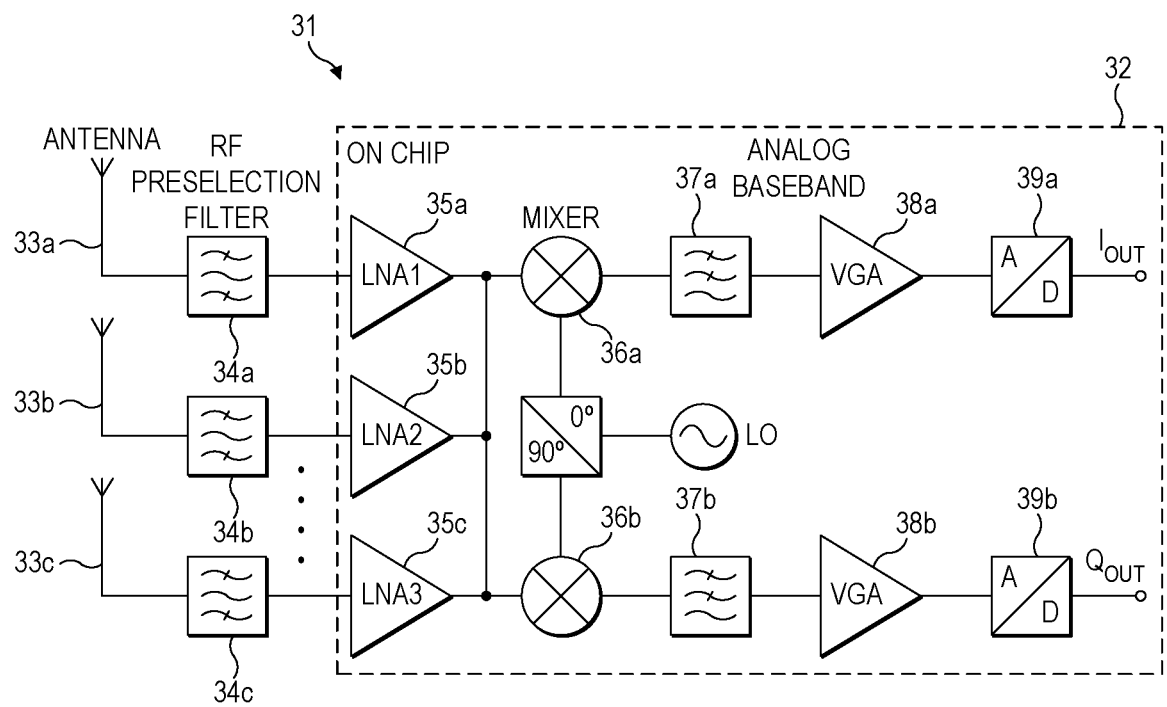
FIG. 2 is a block diagram of a zero-IF receiver architecture for a multi-mode or multi-standard application requiring several external RF filters.

FIG. 2 is a block diagram of a zero-IF receiver architecture for a multi-mode or multi-standard application requiring several external RF filters. In the receiver 31 illustrated in FIG. 2, three antennas 33a-c feed respective received RF signals to respective RF band-pass filters 34a-c (pre-selection filter) that perform the pre-selection of the received RF bands. Each of the bandpass filters is tuned to a respective different frequency. Respective LNAs 35a-c amplify the respective RF signals in order to reduce the noise contributions of the following stages. As in the single band receiver, I and Q down-conversion mixers 36a, 36b down-convert the radio signal to analog baseband. Respective low-pass filters 37a, 37b respectively filter the baseband signal, and respective variable gain stages 38a, 38b process the filtered signal. Finally, respective analog-to-digital converters (ADC) 39a, 39b convert the analog signal to a digital form.

In low-intermediate-frequency (IF) receivers, problems can arise by the presence of an image frequency and so it is preferable to reject the image frequency. The image rejection may be performed, for example, in the digital domain. If the image rejection in the low-IF receiver is carried out in the digital domain, FIGS. 1 and 2 represent also the block diagram of the low-IF receiver architecture. In this case the block diagram of the analogue receiver for the zero-IF and low-IF receivers would be the same.

In most cases, it is the first active circuit blocks in the receiver, i.e. the RF front-end consisting of the LNA and down-conversion mixer, whose performance is the most sensitive to the blocking signals. At the baseband, circuits can be linearised more effectively and blocking signals can be filtered out. It is understood that references to blocking signals also includes RF interference signals and any other type of non-desired signals.

In embodiments of the invention, the filtering requirements for the pre-selection filter may be lowered if the RF front-end of a radio receiver is designed to be sufficiently linear to tolerate blocking signals without compression, and if the blocking signals at the front-end are filtered to a sufficiently low level so that the receiver circuits following the LNA can tolerate them. In some embodiments this allows the RF pre-selection filter to be removed altogether. This significantly lowers the cost and BOM of the entire radio receiver. Simultaneously, the integration level of the receiver can be increased. Finally, higher NF in the RXIC can be tolerated, because the loss associated with the pre-selection filter is not present.

In the embodiments described below, a highly linear LNA combined with on-chip RF filter is provided. The LNA merged with the RF filter represents a small RF input impedance for the blocking signals, which decreases the voltage swing due to the blocking signals at the LNA input improving the LNA linearity.

Figure 3:
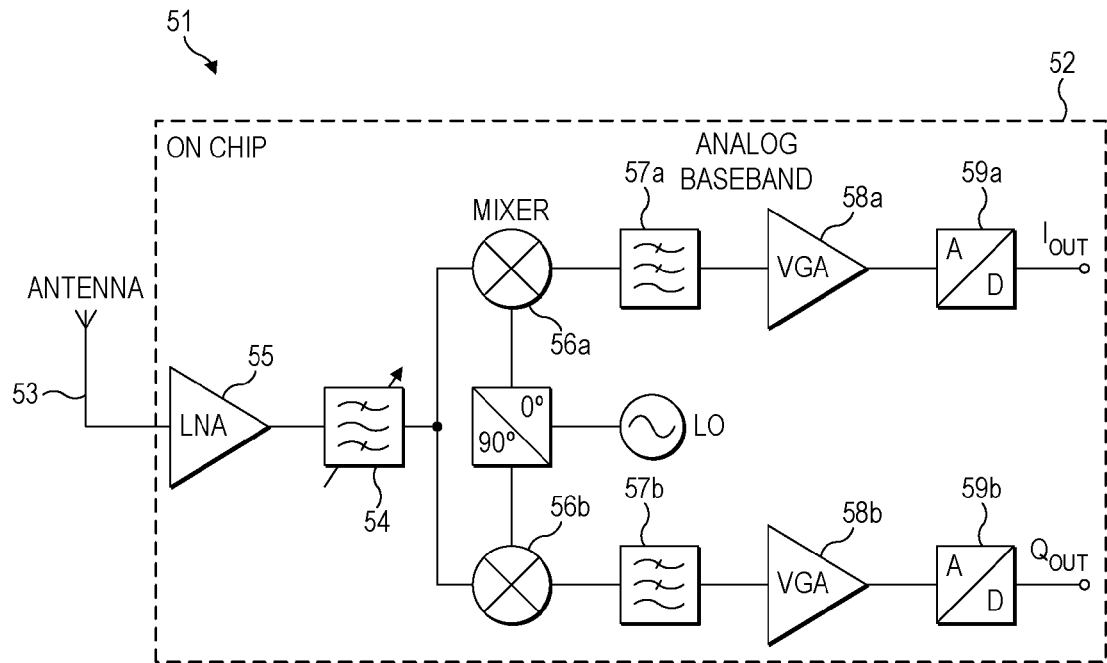
FIG. 3 is a block diagram of a zero-IF receiver architecture for multi-mode or multi-standard applications comprising a frequency selective LNA with on-chip RF filter.

FIG. 3 is a block diagram of one embodiment of the present invention comprising a zero-IF receiver architecture for multi-mode or multi-standard applications. The architecture illustrated in FIG. 3 is similar to the arrangements shown in FIGS. 1 and 2. For example, as before, the RXIC 52 comprises I and Q down-conversion mixers 56a, 56b, respective gain stages 57a, 57b, respective low-pass filters 58a, 58b and respective analog-to-digital converters (ADC) 59a, 59b. However, unlike the arrangements shown in FIGS. 1 and 2, the RXIC 52 front end comprises a frequency selective LNA 55 together with an on-chip RF filter 54. Consequently, the embodiment shown in FIG. 3 does not require external RF filters. Embodiments, such as the one illustrated in FIG. 3, may be implemented using any suitable circuit technology, such as pure digital CMOS technology, for example.

The LNA 55 with on-chip filter 54 may be used in an integrated wireless radio receiver to amplify the desired signal and to filter blocking signals, or other undesirable signals, for example located close to the desired signal. In the illustrated embodiments, for example, approximately 16-20 dB attenuation may be provided for the blocking signals compared to the desired signal. The attenuation may depend on the amplifier architecture, for example whether a four-phase or eight-phase TIF described below is used.

Embodiments of the present invention may be advantageously applied to multi-band radio receivers. Embodiments of the invention are applicable to any time-division multiplexing standards, including TDD WCDMA (Time-Division Duplex Wide-Band Code-Division Multiple Access). For example, it may be possible to implement the radio receiver in applications such as GSM (Global System for Mobile Communications) without an expensive off-chip RF filter. In some embodiments, only a single (balanced) RF input is required in the RXIC to receive all of the GSM bands in the vicinity of 1 GHz and 2 GHz. This is due to the fact that the center frequency of the on-chip RF filter may be tuned to the desired reception frequency simply by tuning the frequency of the local oscillator (LO) signal. Since the center frequencies of the external pre-selection filters shown in FIG. 2 are fixed, each reception band needs its own filter. As a result, the cost of a receiver embodying the invention may be significantly lowered, for example in the embodiment shown in FIG. 3.

In various embodiments, the LNA itself may be designed to be wideband to receive all the necessary frequency bands. With the help of the RF filter, the LNA can also be made to be linear enough to tolerate blocking signals in the GSM. Advantageously, the RF filter implemented in the load of the LNA improves the linearity of the LNA output stage (and in some case also the input stage) by allowing it to better tolerate blocking signals. The RF filter also alleviates the linearity requirements of the down-conversion mixer and the baseband circuits in the receiver downstream.

Figure 4:
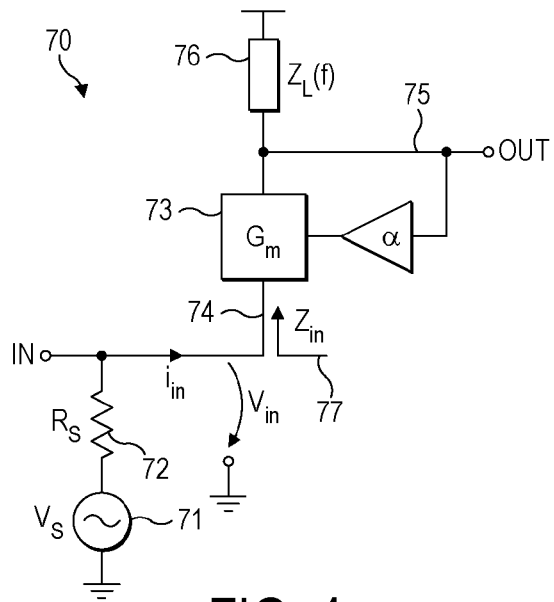
FIG. 4 is a partial circuit diagram of a feedback LNA which may be used in the arrangement shown in FIG. 3.

FIG. 4 is a partial circuit diagram of a feedback LNA which may be used, for example, in the embodiment shown in FIG. 3. The LNA 70 is driven by an antenna represented by the voltage source $v_s$ 71 and source resistance $R_s$ 72. At the amplifier input, the transconductance stage ($G_m$) 73 is controlled by the RF input voltage ($v_{in}$) 74 and the voltage fed back from the LNA output 75 ($\alpha v_{out}$). The transconductance stage 73 converts the control voltages (i.e. $v_{in}$ and $\alpha v_{out}$) to an output current 75 which is fed to the load impedance ($Z_L$) 76. At the load 76, the output RF current is converted to the output voltage 75 ($v_{out}$). Finally, the output voltage is fed to the feedback network having a voltage gain of $\alpha$.

FIG. 4 represents a general diagram of a voltage-voltage feedback LNA. The LNA 55 shown in FIG. 3 may be implemented in any suitable way, examples of which are given below. In some implementations, the LNA 70 shown in FIG. 4 can be used with no feedback (i.e. with $\alpha=0$ in FIG. 4).

The input impedance 77 of the feedback LNA 70 shown in FIG. 4 is of form $$Z_{in}(f) = \frac{v_{in}}{i_{in}} = R_{in0} + \alpha Z_L(f) \quad (1)$$

where the first term ($R_{in0}$) is due to the transconductance stage 73 and may be designed to be frequency independent. In other words, $R_{in0}$ does not depend on the operation frequency (f). On the contrary, the second term ($\alpha Z_L(f)$) due to the feedback network does depend on the operation frequency via load impedance impedance $Z_L(f)$ 76.

Figure 5:
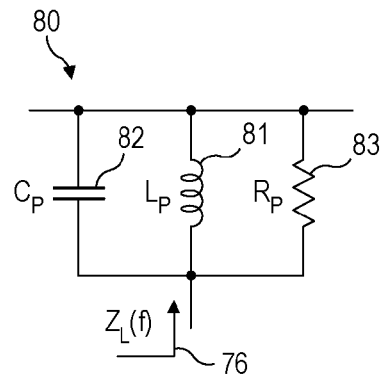
FIG. 5 illustrates a typical damped LC-tuned resonator load used in LNA designs.

In most cases, LNAs employ LC-tuned load impedances at the amplifier output to tune out the parasitics and to peak the voltage gain of the amplifier at the frequency of interest. A damped LC-tuned resonator load 80 used in one embodiment of the LNA 55 is illustrated in FIG. 5. This circuit fits between the out node and the high supply voltage in FIG. 4; the impedance $Z_L$ indicated in FIG. 4 is the impedance shown in FIG. 5. The load impedance 76 can be expressed as $$Z_L(f)^{-1} = j\omega C_p + \frac{1}{j\omega L_p} + \frac{1}{R_L} \quad (2)$$

In practice, the load impedance is designed to be real at the frequency of interest $f_0$, i.e. $Z_L(f_0)=R_L$. This is accomplished by choosing the component values of the inductance ($L_p$) 81 and capacitance ($C_p$) 82 in the resonator so that they are in parallel resonance at $f_0$ $$f_0 = \frac{1}{2\pi \sqrt{L_p C_p}} \quad (3)$$

In another embodiment comprising a multi-standard receiver, the LNA load impedance 76 can be tuned to the various operation frequencies for instance by switching the value of the load capacitance ($C_p$) 82 to guarantee equation (3) is satisfied at different frequencies.

At the frequency band of interest $f_0$, the LNA input impedance 77 is preferably matched to the characteristic impedance ($R_s$) 72 of the antenna (or pre-selection filter). This impedance is typically around 50Ω. In other words, at $f_0$, the LNA input impedance 77 is preferably chosen to fulfill $$Z_{in}(f_0)=R_{in}=R_{in0}+\alpha Z_L(f_0)=R_{in0}+\alpha R_L=R_s \quad (4)$$

At the frequency of interest, the input impedance 77 can be matched to the antenna impedance by tuning the load resonator to achieve $Z_L(f_0)=R_L$ at $f_0$. Again in embodiments comprising a multi-standard receiver, the LNA input impedance 77 may be matched to the antenna impedance at various operation frequencies for instance by switching the value of the load capacitance ($C_p$) 82 to guarantee equations (3) and (4) are satisfied at different frequencies. Thus, by switching a value of a single component (for instance $C_p$ 82) in the LNA load resonator, the load and input impedances 76, 77 can be tuned to various reception bands and the LNA input matching and maximum voltage gain may be guaranteed at several frequency bands. In other words, the minimum of the LNA input reflection coefficient follows the maximum of the amplifier voltage gain. Thus, by providing a component, such as $C_p$, allowing the value of the component to be varied, the voltage-voltage feedback amplifier shown in FIG. 5 is well suited for reconfigurable multi-standard receivers. This allows applications using different radio standards.

As already mentioned, the LNA 70 shown in FIG. 4 can be realized also with no feedback, i.e. with $\alpha=0$. In this particular case, the LNA input impedance 77 is simply $$Z_{in}(f) = \frac{v_{in}}{i_{in}} = R_{in0} \quad (5)$$

Equation 5 shows that, in this case, wideband input impedance matching covering several radio standards at various frequency bands may be provided.

Figure 6:
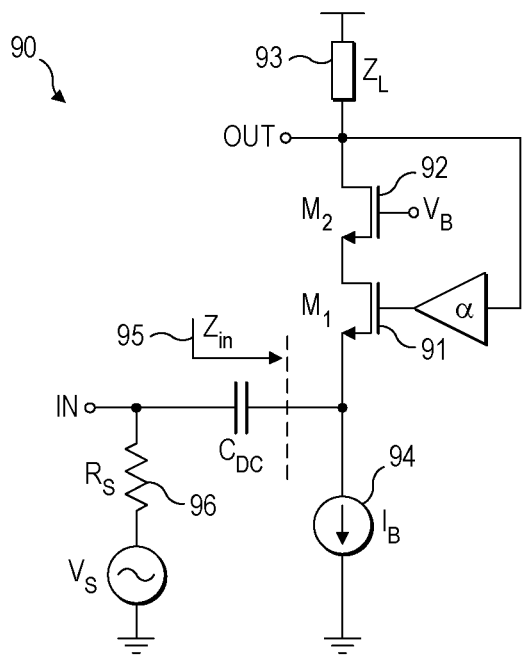
FIG. 6 illustrates one possible implementation of the LNA shown in FIG. 4.

The LNA 70 shown in FIG. 4 used in one embodiment is illustrated in more detail in FIG. 6. The amplifier 90 shown in FIG. 6 consists of the common-gate input field-effect transistor (FET) ($M_1$) 91 with cascade FET ($M_2$) 92 in a voltage-voltage feedback loop. The feedback network having a voltage gain of $\alpha$ may be implemented, for example, with a simple capacitor voltage division. In this embodiment, the load impedance ($Z_L$) 93 is implemented as a tuned load as illustrated in FIG. 5. However, a simple resistive load could alternatively or additionally be used.

The LNA 90 illustrated in FIG. 6 is shown as a single-ended circuit. However, in another embodiment, the LNA 55 is implemented as a differential circuit. The LNA in this embodiment is described in greater detail below with reference to FIG. 8, the left-hand side of which shows a differential feedback LNA. Moreover, although the LNA 90 is shown as a CMOS implementation, bipolar junction transistors (BJT) could also be used. The bias current source ($I_B$) 94 shown in FIG. 6 may also be replaced by a resistor or inductor in other embodiments.

In this case, the input impedance 95 of the LNA 90 can be approximated as $$Z_{in}(f) = \frac{v_{in}}{i_{in}} = \frac{1}{g_m} + \alpha Z_L(f) \quad (6)$$

and the input impedance matching requires that at the frequency band of interest ($f_0$)

$$Z_{in}(f_0) = R_{in} = \frac{1}{g_m} + \alpha Z_L(f_0) = \frac{1}{g_m} + \alpha R_L = R_s \qquad (7)$$

where $g_m$ is the transconductance of the input FET $M_1$ 91, $R_s$ 96 is the characteristic impedance of the antenna and $Z_L(f_0) = R_L$. Moreover, when the input impedance 95 of the LNA 90 is matched to the $R_s$ 96, the voltage gain of the LNA 90 at the frequency of interest is $$A_v(f_0) = \frac{v_{out}}{v_{in}} = \frac{R_L}{R_s} \qquad (8)$$

Figure 7:
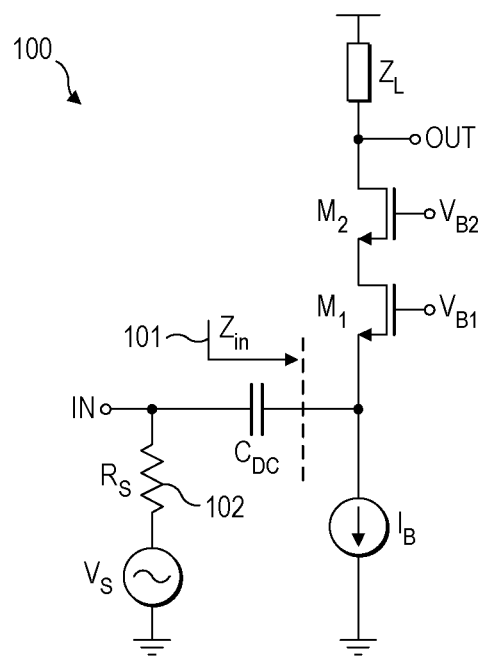
FIG. 7 illustrates a common-gate LNA corresponding to the LNA shown in FIG. 6 in the case of no feedback (α=0)

In the case of no feedback (i.e. $\alpha = 0$), the LNA shown in FIG. 6 reduces to a common-gate amplifier 100 illustrated in FIG. 7. In the common-gate LNA 100, the input impedance is approximately $$Z_{in}(f) = \frac{1}{g_m} \qquad (9)$$

Again, it is required that at the frequency band of interest, $1/g_m = R_s$. Moreover, provided that the input impedance 101 of the common-gate LNA 100 is matched to the $R_s$ 102, the voltage gain of the LNA 100 is given by Equation 8.

Compared to the common-gate LNA 100 shown in FIG. 7, the voltage-voltage feedback LNA 90 shown in FIG. 6 may achieve a lower NF. This is due to the fact that in the feedback LNA 90, higher input FET transconductance (and thus lower NF) may be chosen while the feedback network guarantees the input matching. The noise factor of the common-gate LNA 100 at impedance match can be approximated as $$F = 1 + \gamma \qquad (10)$$

whereas the noise factor of the feedback LNA 90 shown in FIG. 6 is $$F = 1 + \frac{\gamma}{g_m R_s} \qquad (11)$$

Here $\gamma$ is $2/3$ for long-channel FETs and in Equation 11, $g_m R_s > 1$ may be satisfied depending on design. The feedback network also linearises the LNA 90 and allows it to tolerate large blocking signals.

Figure 8:
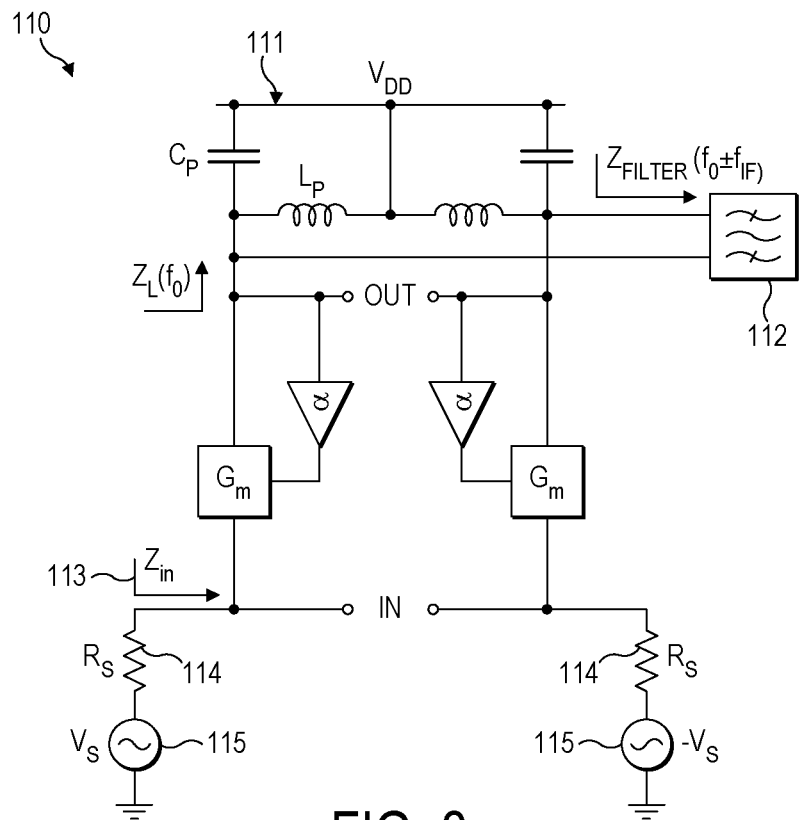
FIG. 8 illustrates a circuit diagram of a differential feedback LNA with on-chip filter used in the embodiment shown in FIG. 3.

FIG. 8 illustrates a circuit diagram of a differential feedback LNA 111 with on-chip filter 112 which may be used in the embodiment shown in FIG. 3. The filter 112 is connected at the amplifier output in parallel with the load LC-resonator. However, a simple resistive load could also be used. Various embodiments of the filter 112 are described in greater detail below with reference to FIGS. 15 to 18.

Figure 9:
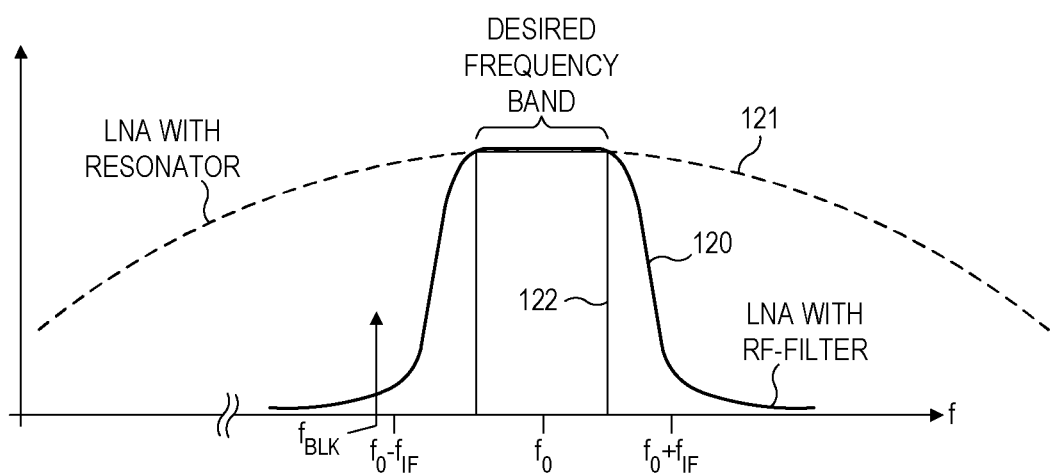
FIG. 9 shows the frequency response of the feedback LNA shown in FIG. 8 with and without the RF filter.

FIG. 9 shows the frequency response of the feedback LNA 111 with the RF filter 112, indicated as a solid line 120. FIG. 9 also shows what the frequency response would be without the RF filter 112, shown as a dotted line 121.

In the LNA 111, the load resonator is chosen to resonate at the RF operation frequency $f_0$ $$f_0 = \frac{1}{2\pi \sqrt{L_p C_p}} \qquad (12)$$

In addition, at the RF filter's passband 122 (shown in FIG. 9), i.e. located approximately at the frequencies of $f_0 \pm f_{3dB}$ where $f_{3dB}$ is the −3 dB corner frequency of the filter 112, the filter 112 represents a resistive load ($Z_{FILTER}(f) = Z_L(f) = R_L$) for the amplifier 111. Moreover, at the filter's passband 122, the LNA input impedance 113 is designed to match the antenna impedance $$Z_{in}(f_0) = R_{in} = R_{in0} + \alpha Z_L(f_0) = R_{in0} + \alpha R_L = R_s \qquad (13)$$

and the voltage magnitude at the amplifier's differential output is $$|v_{OUT}(f_0)| = \frac{R_L}{R_s} \cdot \frac{2v_s}{2} = \frac{R_L}{R_s} v_s \qquad (14)$$

where the factor of two in the numerator is due to the fact that differential output voltage is considered. Here, $v_s$ is the voltage magnitude of the desired RF signals at the antenna. Equation 14 represents the output voltage magnitude of the desired RF signals located at the RF filter's passband 122.

At the stopband of the filter, i.e. at the frequency offsets of $\pm f_{IF}$, or larger, from the RF operation frequency $f_0$ 123 as shown in FIG. 11 (here, naturally $f_{IF} \ll f_0$), the filter 112 represents a low magnitude impedance $|Z_{FILTER}(f_0 \pm f_{IF})|$ at the LNA output. In practice, the filter's stopband input impedance is much lower than its passband input impedance, i.e. $|Z_{FILTER}(f_0 \pm f_{IF})| \ll R_L$. For the same reason, the magnitude of the amplifier's input impedance at the filter's stopband $$|Z_{in}(f_0 \pm f_{IF})| = |R_{in0} + \alpha Z_L(f_0 \pm f_{IF})| = |R_{in0} + \alpha Z_{FILTER}(f_0 \pm f_{IF})| \approx R_{in0} \qquad (15)$$

is smaller than the antenna impedance $R_s$ 114. As a result, the blocking signals located at the stopband of the filter 112 experience attenuation already at the LNA input compared to the desired RF signals at the filter passband. Thus, embodiments in which blocking signals are attenuated compared to desired signals may provide significant advantages over known arrangements. In fact, the voltage gain experienced by the blocking signals from the antenna to the LNA input is given by $$A_{v,in}(f_0 \pm f_{IF}) = \frac{R_{in0}}{R_s + R_{in0}} < \frac{1}{2} \qquad (16)$$

whereas the desired RF signals at the filter passband have a gain of $1/2$:

$$A_{v,in}(f_0) = \frac{R_{in}}{R_s + R_{in}} = \frac{R_s}{R_s + R_s} = \frac{1}{2} \qquad (17)$$

In addition, since the LNA input impedance 113 is not matched to the antenna impedance at the frequency of blocking signals, the blocking signals experience power reflection back to the antenna contributing to reduce signal processing at the interferer or blocker frequency. Thus, since the voltage magnitudes of the blocking signals are already attenuated at the LNA input, they generate less distortion due to the non-linear voltage-to-current conversion at the LNA input stage. As a result, the linearity of the LNA 111 is significantly improved. To summarise, the feedback action combined with the filtering linearises the LNA allowing it to better tolerate blocking signals and it also filters out blocking signals already at the LNA input before the first non-linear circuit element in the RXIC 52.

Figure 10:
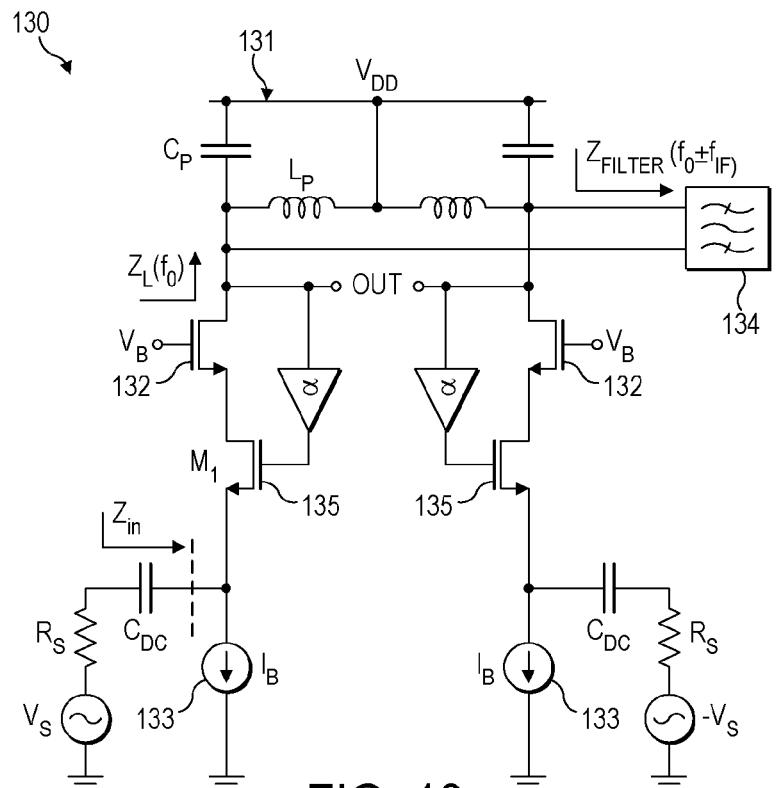
FIG. 10 illustrates one possible circuit level implementation of the feedback LNA shown in FIG. 8.

FIG. 10 illustrates a circuit level implementation of the feedback LNA 111 shown in FIG. 8 in one embodiment. Here, the amplifier 131 itself consists of the common-gate FET (M$_1$) 135 with cascade FET (M$_2$) 132 in a voltage-voltage feedback loop. The feedback network having a voltage gain of a may be implemented with a simple capacitor voltage division. Although shown as a CMOS implementation in this embodiment, bipolar junction transistors (BJT) could be used in other embodiments. The bias current source (I$_B$) 133 shown in FIG. 10 may be replaced by a resistor or inductor in alternative embodiments. In some embodiments, a resonator load may not be needed and, for example, a simple resistive load may be employed. Moreover, the cascade FET 132 may not be needed in some embodiments.

Again, the load resonator is chosen to resonate at the RF operation frequency f$_0$ (see Equation 12). Moreover, at the RF filter's passband 122 (as shown in FIG. 9), the filter 134 represents a resistive load (Z$_{FILTER}$(f)=Z$_L$(f)=R$_L$) for the amplifier 131 and the LNA input impedance is designed to match the antenna impedance $$Z_{in}(f_0) = R_{in} = \frac{1}{g_m} + \alpha Z_L(f_0) = \frac{1}{g_m} + \alpha R_L = R_s \quad (18)$$

where g$_m$, is the transconductance of the input FET M$_1$.

The differential output voltage magnitude of the desired RF signals located at the RF filter's passband 122 is $$|v_{OUT}(f_0)| = \frac{R_L}{R_s} \cdot \frac{2v_s}{2} = \frac{R_L}{R_s} v_s \quad (19)$$

At the stopband of the filter 134, the filter 134 represents a low magnitude impedance |Z$_{FILTER}$(f$_0$±f$_{IF}$)| at the LNA output and its input impedance is much lower than its passband input impedance, i.e. |Z$_{FILTER}$(f$_0$±f$_{IF}$)|<<R$_L$. Thus, the magnitude of the LNA input impedance at the filter's stopband (and therefore at the frequencies of the blocking signals) is given by $$|Z_{in}(f_0 \pm f_{IF})| = \left|\frac{1}{g_m} + \alpha Z_{FILTER}(f_0 \pm f_{IF})\right| \approx \frac{1}{g_m} \quad (20)$$

Again, since this is smaller than the antenna impedance R$_s$, the blocking signals located at the stopband of the filter 134 experience attenuation already at the LNA input compared to the desired RF signals at the filter passband. As a result, the blocking signals generate less distortion at the LNA input. In this case, the voltage gain experienced by the blocking signals from the antenna to the LNA input is given by $$A_{v,in}(f_0 \pm f_{IF}) = \frac{\frac{1}{g_m}}{\frac{1}{g_m} + R_s} = \frac{1}{1 + g_m R_s} < \frac{1}{2} \quad (21)$$

whereas the desired RF signals have a gain of ½ (see Equation 17). Similarly, it can be shown that at the differential output of the LNA 131, the voltage magnitude of the blocking RF signals located at the RF filter's stopband is $$|v_{OUT}(f_0 \pm f_{IF})| = \left|\frac{g_m Z_{FILTER}(f_0 \pm f_{IF})}{1 + g_m R_s}\right| \cdot (2v_s) \quad (22)$$

where v$_s$ now represents the magnitude of the blocking signals at the antenna.

The ratio of the voltage magnitude of the desired RF signal to the voltage magnitude of the blocking signal at the LNA output may be used to define the concept of selectivity. In this case, for a given voltage magnitude v$_s$ at the antenna, the selectivity is obtained by dividing Equation 19 by Equation 22. Thus, the selectivity of the feedback LNA 131 with on-chip RF filter 134 shown in FIG. 10 is $$\text{Selectivity} = \frac{(1 + g_m R_s) R_L}{2 g_m R_s |Z_{FILTER}(f_0 \pm f_{IF})|} \quad (23)$$

It can be seen that the selectivity is improved by decreasing the filter's stopband impedance.

Figure 11A:
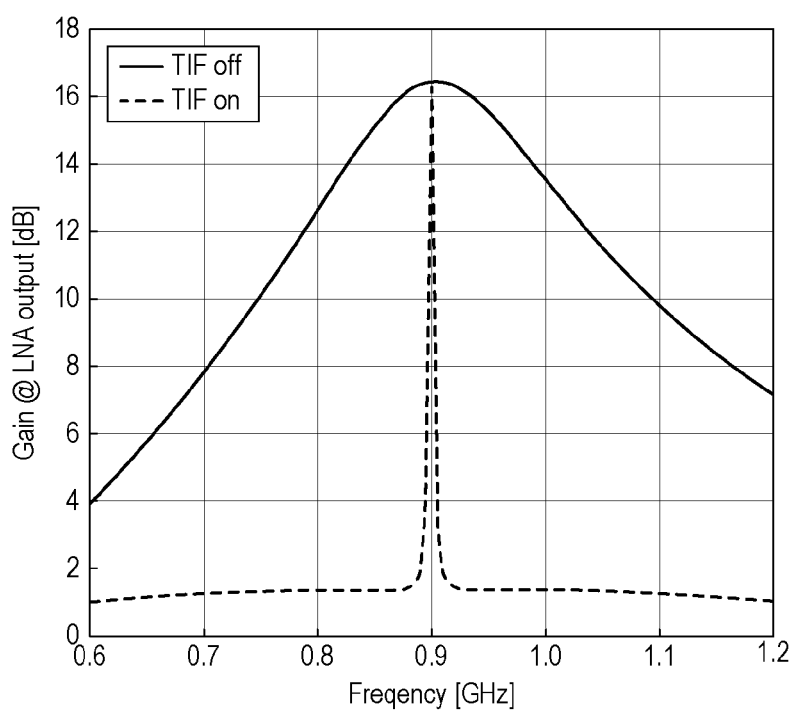
FIG. 11a illustrates the frequency response of the feedback LNA shown in FIG. 10 with and without the on-chip RF filter at the LNA output in the case that the RF filter is a four-phase TIF shown in FIG. 15.
Figure 11B:
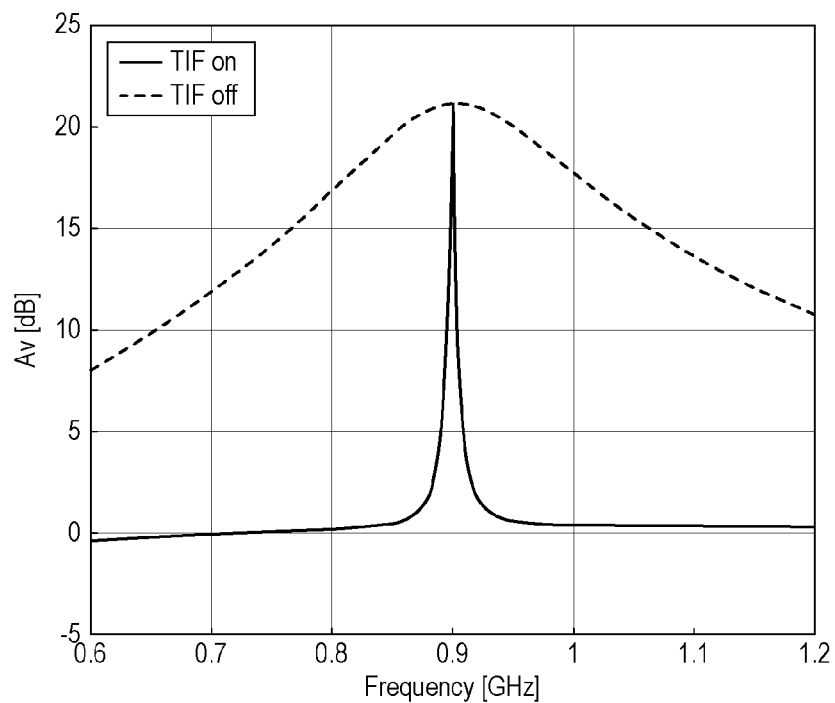
FIG. 11b illustrates the frequency response of the feedback LNA shown in FIG. 10 with and without the on-chip RF filter at the LNA output in the case that the RF filter is a eight-phase TIF shown in FIG. 17.

FIG. 11a illustrates the simulated frequency response (i.e. the voltage gain) of the actual transistor level realization of the feedback LNA 131 shown in FIG. 10 with and without the on-chip RF filter 134 at the LNA output. In this example, the RF filter comprises a four-phase TIF, described in greater detail below. Here, the circuit is implemented using a 65 nm CMOS process. From FIG. 11 it can be seen that the feedback in the LNA 131 together with the RF filter 134 in the load creates very sharp bandpass response in the vicinity of the RF operation frequency (here 900 MHz). FIG. 11b illustrates the simulated frequency response of the feedback LNA 131 shown in FIG. 10 with and without the on-chip RF filter 134 at the LNA output in the case that the RF filter comprises an eight-phase TIF, described in greater detail below.

Figure 12:
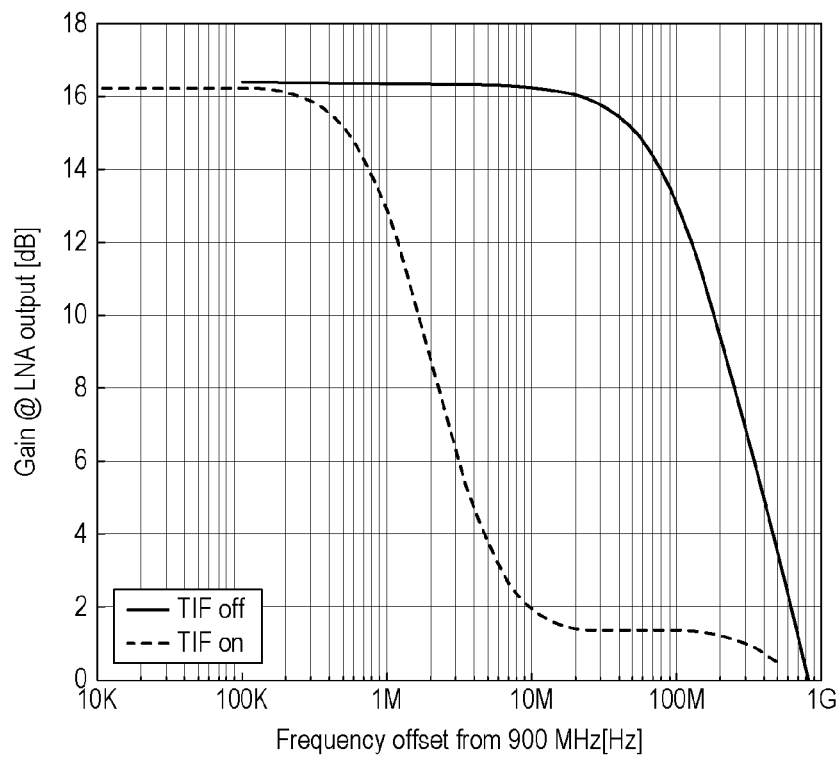
FIG. 12 shows the voltage gain of the feedback LNA shown in FIG. 10 with and without the on-chip RF filter in the vicinity of the RF operation frequency.

FIG. 12 shows the simulated voltage gain of the feedback LNA 131 shown in FIG. 10 using a 65 nm CMOS process with and without the on-chip RF filter 134 in the vicinity of the RF operation frequency (here 900 MHz). In this example, the RF filter comprises a four-phase TIF. It can be seen that without the RF filter 134 based on the transferred impedance filter (TIF), the −3 dB frequency of the LNA 131 is about 100 MHz. However, with the RF filter 134 at the LNA output, as low as 1 MHz of −3 dB frequency is obtained. Moreover, for the blocking signals located for instance at the offset frequency of 20 MHz from the desired RF signal, about 15-dB attenuation can be guaranteed.

Figure 13:
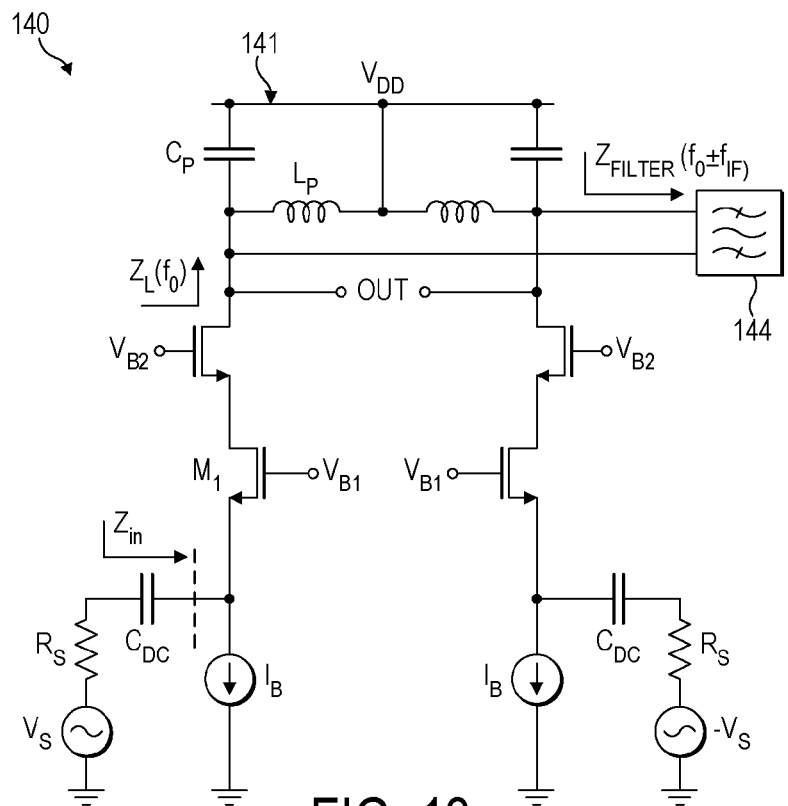
FIG. 13 illustrates a common-gate LNA corresponding to the LNA shown in FIG. 10 in the case of no feedback ($\alpha$=0)

In the case of no feedback (i.e. α=0), the LNA 131 shown in FIG. 10 reduces to a common-gate amplifier 141, as shown in FIG. 13, whose input impedance is approximately 1/g$_m$. Since there is no feedback, this is also the input impedance seen by the blocking signals. Moreover, because 1/g$_m$=R$_s$ must be chosen, both the desired and blocking RF signals experience a gain of ½ from the antenna to the LNA input.

Finally, at the RF filter's passband, the voltage amplitude of the desired RF signals at the differential LNA output is given by Equation 19.

At the differential output of the common-gate LNA 141 with on-chip RF filter 144 shown in FIG. 13, the voltage magnitude of the blocking RF signals located at the RF filter's stopband is $$|v_{OUT}(f_0 \pm f_{IF})| = \frac{|Z_{FILTER}(f_0 \pm f_{IF})|}{R_s} \cdot (v_s) \quad (24)$$

Thus, in this case the selectivity of the circuit shown in FIG. 13 is $$\text{Selectivity} = \frac{R_L}{|Z_{FILTER}(f_0 \pm f_{IF})|} \quad (25)$$

which is seen to depend only on the ratio of the filter's passband impedance to the stopband impedance.

In the various embodiments of an LNA with on-chip RF filter described herein, the LNA input impedance may be matched to the antenna impedance at least at the desired reception band. At the frequencies of blocking signals, the LNA input impedance may be designed to match the antenna impedance (for instance as in the common-gate LNA shown in FIG. 13), but input impedance matching may not nevertheless be needed for the blocking signals (as in the case of feedback LNA shown in FIG. 10). However, it is preferable to provide a low LNA input impedance at the blocking frequencies to minimize the distortion generated by the blocking signals at the LNA input. This is the case both in the common-gate LNA illustrated in FIG. 13 and in the feedback LNA illustrated in FIG. 10, in which the RF filter 134 represents a small load impedance for the LNA 131 at the blocking frequencies, and through the feedback, this small load impedance is reflected to the LNA input. Finally, at the LNA output, the RF filter 134 provides large load impedance for the desired RF signals and small impedance for the interference signals. As a result, blocking signals are attenuated at the LNA output, and depending on the LNA topology, already at the LNA input.

In some embodiments, since the center frequency of the RF filter at the LNA output is tunable via the LO signal frequency with high precision, the merged LNA and RF filter may be used in multi-standard radio receivers to receive several radio standards at various frequency bands. In addition, in embodiments of the invention, bulky and expensive external pre-selection filters may be replaced with a fully integrated filter.

Various embodiments of the on-chip RF filter will now be described with reference to FIGS. 14 to 18. These embodiments are based on a transferred-impedance filtering (TIF) technique. In this technique, a lowpass response of a baseband RC-pole is transferred to a bandpass equivalent at RF frequencies. As a result, a sharp on-chip bandpass filter at RF can be realized.

Embodiments of a TIF filter comprise one or more filter components. Each filter component comprises a first input and a second input for receiving the amplifier output. A first switch (such as a transistor switch) selectively connects the first input to a first impedance (such as a capacitor) and a second switch selectively connects the first input to a second impedance. Similarly, a third switch selectively connects the second input to the first impedance and a fourth switch selectively connects the second input to the second impedance. The first and fourth switches are controlled by a first oscillator signal and the second and third switches are controlled by a second oscillator signal that is 180° out of phase with the first oscillator signal. A four-phase TIF 150, described in greater detail below with reference to FIGS. 15 and 16 comprise two filter components 153a, 153b in which the first oscillator signal of the second filter component is 90° out of phase with the first oscillator signal of the first filter component. An eight-phase TIF 160, described in greater detail below with reference to FIGS. 17 and 18 comprise four filter components 163a-d in which the first oscillator signal of the second, third and fourth filter components 163b-d are respectively 45°, 90° and 135° out of phase with the first oscillator signal of the first filter component 163a.

Figure 14:
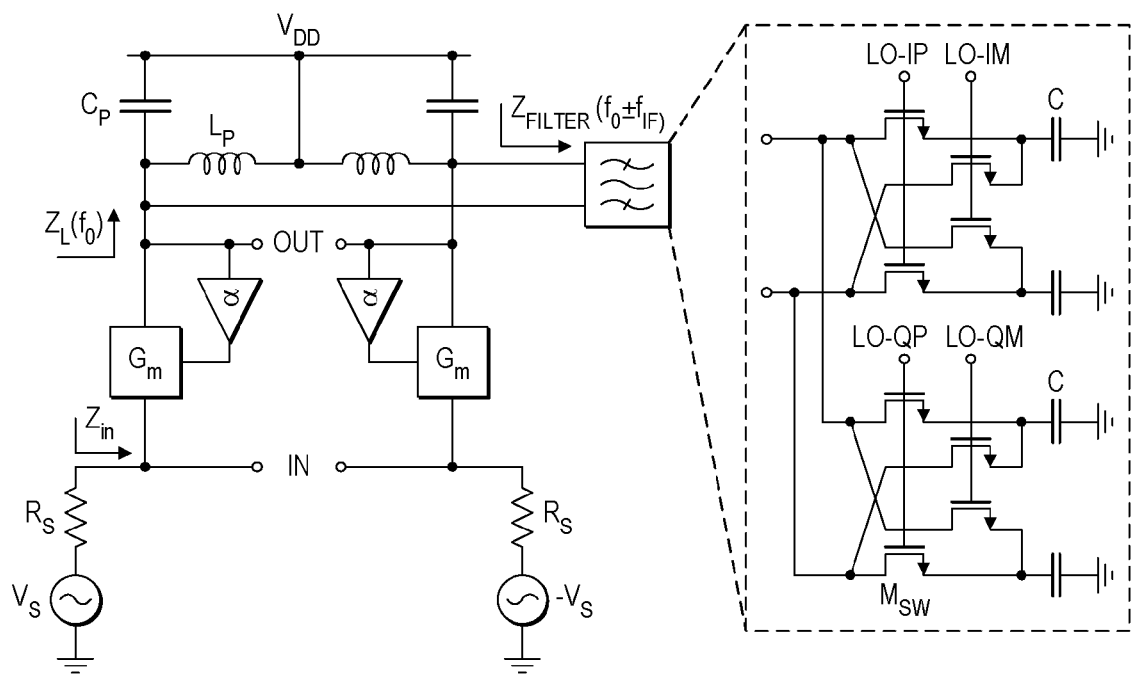
FIG. 14 illustrates the differential feedback LNA with on-chip filter shown in FIG. 8 in the case that the filter is a four-phase TIF shown in FIG. 15.
Figure 15:
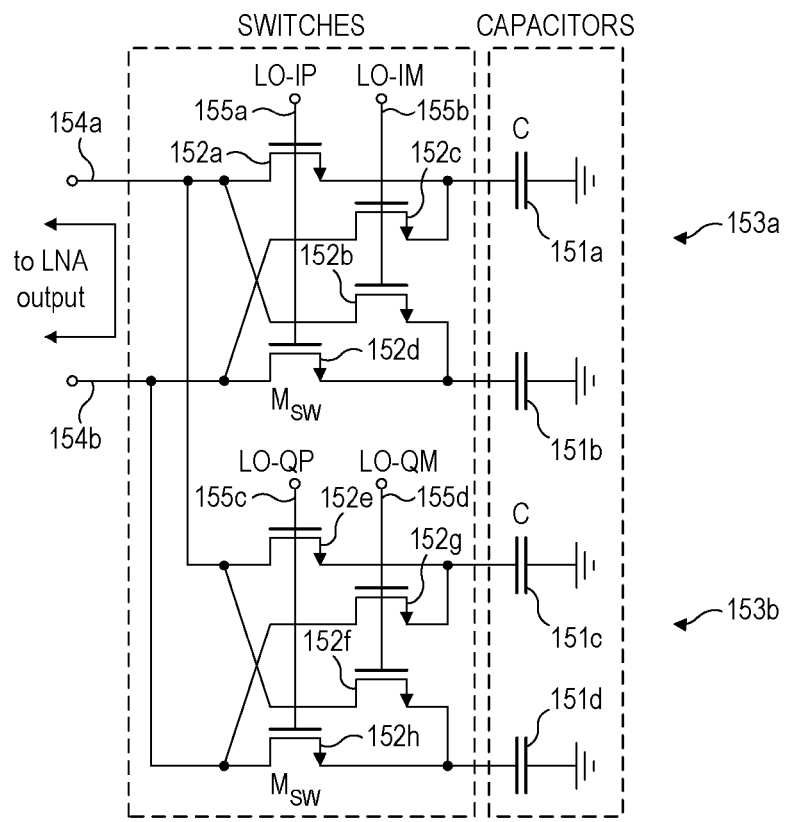
FIG. 15 illustrates a four-phase transferred-impedance filter (TIF) which may be used in embodiments of the invention.
Figure 16:
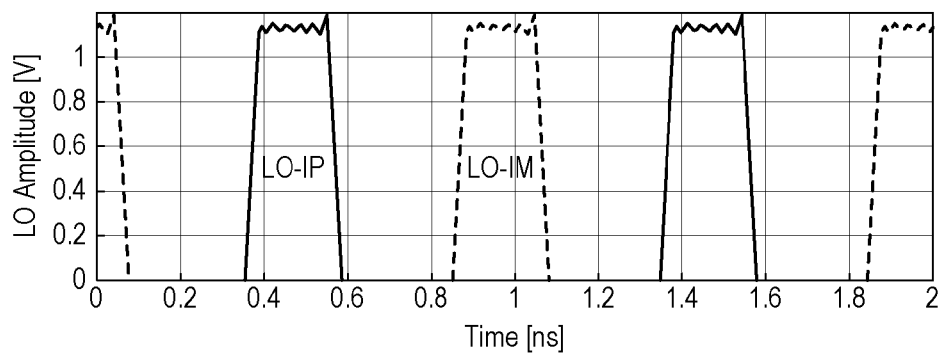
FIG. 16 shows typical LO voltage waveforms driving the four-phase TIF shown in FIG. 15.
Figure 16:
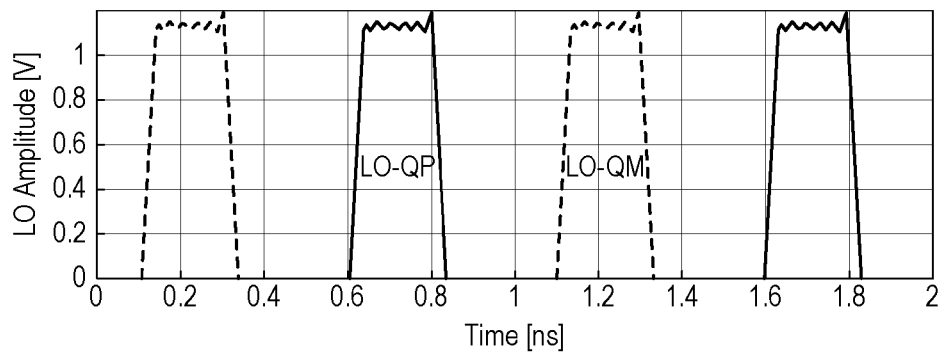

FIG. 14 illustrates the differential feedback LNA with on-chip filter shown in FIG. 8 in the case that the filter is a four-phase TIF. The transferred-impedance filter 150 shown in FIG. 15 comprises capacitors 151a-d and metal-oxide semiconductor (MOS) switches 152a-h driven by an LO signal with quadrature phases and having a duty cycle of about 20%, or less than 25%. The TIF 150 shown in FIG. 15 is referred to as a four-phase TIF. Typical LO voltage waveforms driving the transferred-impedance filter are illustrated in FIG. 16. Specifically, FIG. 16 shows the rail-to-rail I and Q LO signals with a 20% duty cycle driving the four-phase TIF 150. Four phases of the LO signal are required in this embodiment. In this example, the supply voltage is 1.2V.

The TIF 150 shown in FIG. 15 can also be used as a down-conversion mixer. In some embodiments, this may be a very useful property of the TIF 150. The down-converted signals, both I and Q phases, are available at the capacitors 151a-d shown in FIG. 15.

Figure 17:
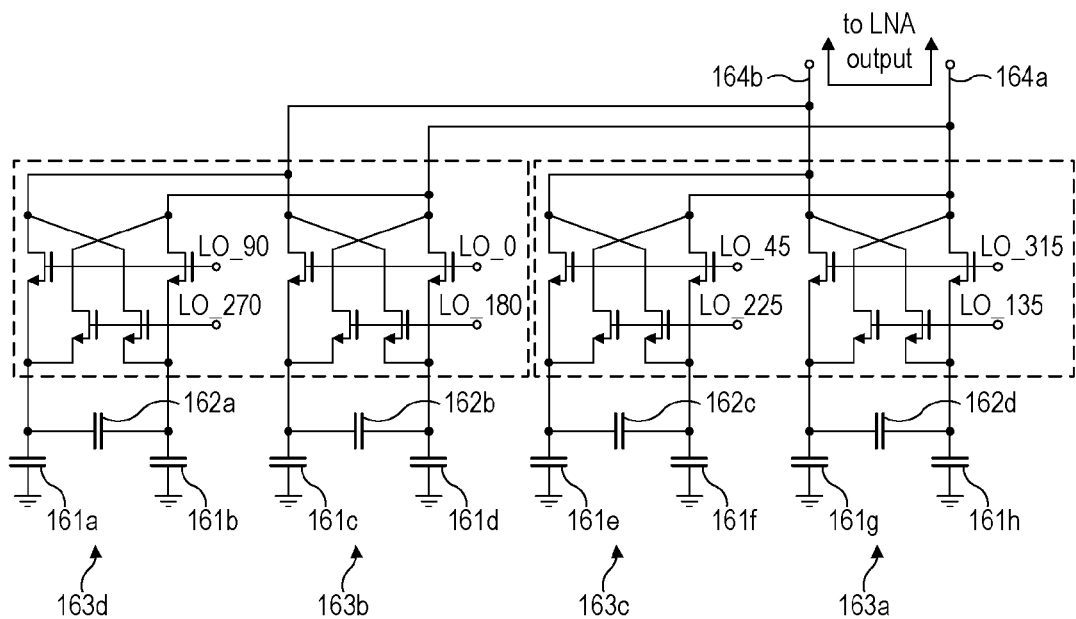
FIG. 17 illustrates an eight-phase TIF which may be used in embodiments of the invention.
Figure 18:
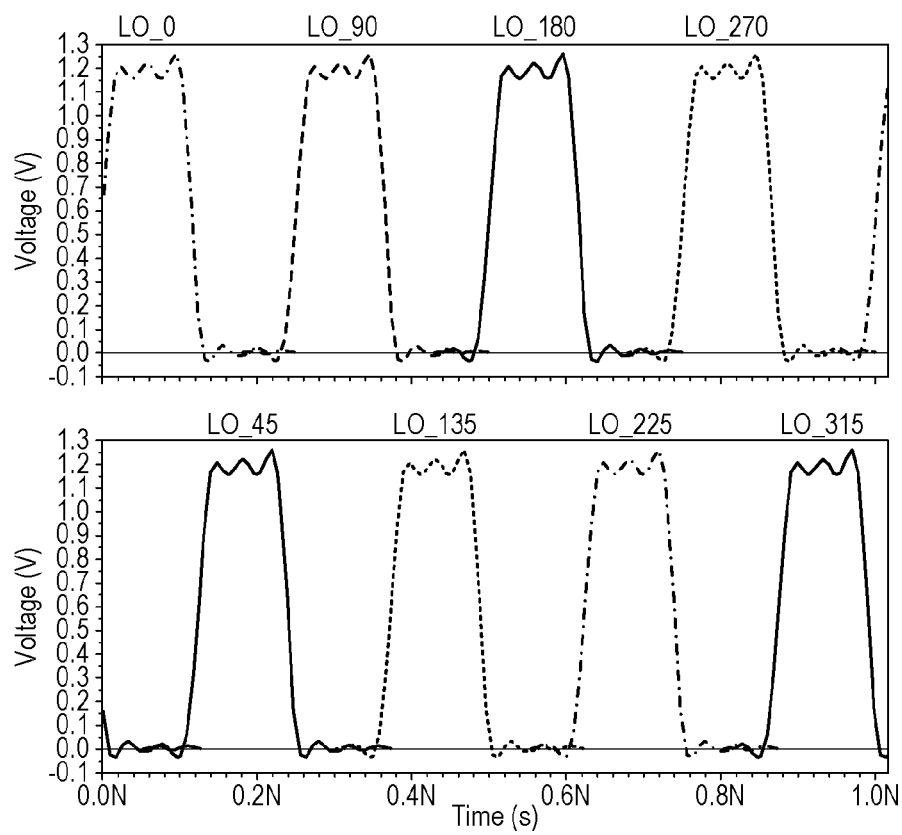
FIG. 18 shows typical LO voltage waveforms driving the eight-phase TIF shown in FIG. 17.

In other embodiments, a sharper on-chip bandpass filter at RF may be created by employing 16 switches (instead of 8 switches shown in FIG. 15) driven by an LO signal having eight phases and duty cycle of about 12.5% (100%/8), or less. One embodiment is illustrated in FIG. 17 and is referred to as an eight-phase TIF 160. It can be seen that in the eight-phase TIF 160, twice as many capacitors 161a-h are needed compared to the four-phase TIF 150 shown in FIG. 15. However, it can be shown that in the eight-phase TIF 160 the total capacitance needed to achieve a certain corner frequency in the filter is actually smaller compared to the four-phase TIF 150. Thus, the eight-phase TIF 160 provides lower silicon area compared to the four-phase TIF 150. Typical LO voltage waveforms driving the eight-phase TIF are illustrated in FIG. 18. Specifically, FIG. 18 shows the rail-to-rail I and Q LO signals with 12.5% duty cycle driving the eight-phase TIF. Eight phases of the LO signal are required in this embodiment. In this example, the supply voltage is 1.2V. With the eight-phase TIF, larger amplifier voltage gain and attenuation for the blocking signals can be achieved compared to the four-phase TIF. For example, voltage gain of around 20 dB, and also 20 dB attenuation for the interference signals, can be achieved with respect to the desired signals.

Again, the eight-phase TIF 160 shown in FIG. 17 can also be used as a down-conversion mixer. By combining the four differential down-converted signals at the capacitors 161a-h shown in FIG. 17 in an appropriate way, the down-conversion from the harmonics of the LO signal can be cancelled. In a radio receiver having no preselection filter, this may be a very useful feature.

The skilled person will understand that various modifications may be made to the TIF filters illustrated in FIGS. 15 and 17. For example, the capacitors 151, 161 and 162 used in the TIF filters may be replaced with other components providing an impedance. Furthermore, in one embodiment, the capacitors 162, or alternative components, used in the eight-phase TIF illustrated in FIG. 17 are optional and may be eliminated. The skilled person would also appreciate that the TIF filters illustrated in FIGS. 15 and 17, as well as other embodiments and variations, may be used in a wide variety of applications other than those described above, and in particular may be used in applications outside the field of radio receivers.

In embodiments of the invention, the transferred-impedance filter 150, 160 is connected at the LNA output. If the low-noise amplifier utilizes an LC-resonator load at the output, the transferred-impedance filter 150, 160 is connected in parallel with the LC-resonator circuit. The filter 150, 160 determines both the LNA passband impedance and stopband rejection. Finally, the clocking frequency of the transferred-impedance filter (i.e. the LO frequency) sets the center frequency of the filter. In other words, the center frequency of the filter is tunable via LO frequency.

Embodiments may combine TIF and LNA technology such that an external preselection filter is no longer required.

Embodiments using 16 switches and 8 phases may enable higher selectivity to be achieved and may improve the attenuation of interference signals.

In some embodiments, the TIF and LNA may be combined such that the linearity of the LNA input stage is relaxed by the TIF in the feedback path.

While various exemplary embodiments of the invention have been described above, various modifications will readily occur to the skilled person.

The invention claimed is:

1. An integrated circuit for a radio receiver, the integrated circuit comprising:
    a radio-frequency amplifier and
    a radio-frequency filter,
    the radio-frequency amplifier being arranged to receive radio-frequency signals from an antenna,
    the radio-frequency filter being connected to the radio-frequency amplifier output,
    the output of the radio-frequency filter being provided to a processing stage of the receiver,
    the radio-frequency amplifier comprising an amplifying stage controlled by a radio-frequency input signal and a signal fed back from the radio-frequency filter,
    the radio-frequency amplifier input impedance being substantially matched to the antenna impedance at a frequency band of interest,
    the signal fed back from the radio-frequency filter providing attenuation of signals outside the frequency band of interest at the radio-frequency amplifier input,
    the radio-frequency filter comprising at least a first filter component, the first filter component comprising:
        a first input and a second input for receiving the radio-frequency amplifier output;
        a first switch arranged to selectively connect the first input to a first impedance;
        a second switch arranged to selectively connect the first input to a second impedance;
        a third switch arranged to selectively connect the second input to the first impedance; and
        a fourth switch arranged to selectively connect the second input to the second impedance;
    the first and fourth switches being controlled by a first oscillator signal and the second and third switches being controlled by a second oscillator signal that is 180° out of phase with the first oscillator signal.

2. The integrated circuit according to claim 1 in which the frequency band of interest is the passband of the radio-frequency filter.

3. The integrated circuit according to claim 1 in which the radio-frequency amplifier input is not matched to the antenna impedance at the frequency of undesirable signals.

4. The integrated circuit according to claim 1 in which the radio-frequency amplifier input impedance is lower than the antenna impedance outside the frequency band of interest, thereby providing attenuation of signals outside the frequency band of interest at the radio-frequency amplifier input.

5. The integrated circuit according to claim 1 in which the radio-frequency filter is tunable.

6. The integrated circuit according to claim 5 in which the radio-frequency filter is tunable with an oscillator signal.

7. The integrated circuit according to claim 1 in which the radio-frequency amplifier is a differential amplifier.

8. The integrated circuit according to claim 1 in which the radio-frequency filter further comprises a second filter component, the second filter component comprising:
    a first input and a second input for receiving the radio-frequency amplifier output;
    a first switch arranged to selectively connect the first input to a first impedance;
    a second switch arranged to selectively connect the first input to a second impedance;
    a third switch arranged to selectively connect the second input to the first impedance; and
    a fourth switch arranged to selectively connect the second input to the second impedance;
    the first and fourth switches being controlled by a first oscillator signal and the second and third switches being controlled by a second oscillator signal that is 180° out of phase with the first oscillator signal; wherein the first oscillator signal of the second filter component is 90° out of phase with the first oscillator signal of the first filter component.

9. The integrated circuit according to claim 8 in which the radio-frequency filter further comprises third and fourth filter components, the third and fourth filter components each comprising:
    a first input and a second input for receiving the radio-frequency amplifier output;
    a first switch arranged to selectively connect the first input to a first impedance;
    a second switch arranged to selectively connect the first input to a second impedance;
    a third switch arranged to selectively connect the second input to the first impedance; and
    a fourth switch arranged to selectively connect the second input to the second impedance;
    the first and fourth switches being controlled by a first oscillator signal and the second and third switches being controlled by a second oscillator signal that is 180° out of phase with the first oscillator signal; wherein the first oscillator signal of the second, third and fourth filter components are respectively 45°, 90° and 135° out of phase with the first oscillator signal of the first filter component.

10. The integrated circuit according to claim 1 in which at least one of the impedances is a capacitor.

11. The integrated circuit according to claim 1 in which at least one switch comprises a transistor switch.

12. The integrated circuit according to claim 1 in which the oscillator signals are derived from one oscillator signal.

13. The integrated circuit according to claim 12 in which the oscillator signal is tunable.

14. The integrated circuit according to claim 8 in which the duty cycle of the oscillator signal is 25% or less.

15. The integrated circuit according to claim 9 in which the duty cycle of the oscillator signal is 12.5% or less.

16. An integrated circuit for a radio receiver, the integrated circuit comprising:
- a radio-frequency amplifying means for receiving radio-frequency signals from an antenna; and
- a radio-frequency filtering means for providing an output to a processing stage of the receiver and receiving an input from the radio-frequency amplifying means,
- the radio-frequency amplifying means comprising an amplifying stage controlled by a radio-frequency input signal and a signal fed back from the radio-frequency filtering means,
- the radio-frequency amplifying means input impedance being substantially matched to the antenna impedance at a frequency band of interest,
- the signal fed back from the radio-frequency filtering means providing attenuation of signals outside the frequency band of interest at the radio-frequency amplifying means input,
- the radio-frequency filtering means comprising at least a first filter component, the first filter component comprising:
  - a first input means and a second input means for receiving an output from the radio-frequency amplifying means;
  - a first switching means for selectively connecting the first input means to a first impedance;
  - a second switching means for selectively connecting the first input means to a second impedance;
  - a third switching means for selectively connecting the second input means to the first impedance; and
  - a fourth switching means for selectively connecting the second input means to the second impedance;
- the first and fourth switching means being controlled by a first oscillator signal and the second and third switching means being controlled by a second oscillator signal that is 180° out of phase with the first oscillator signal.

* * * * *